United States Patent
Manahan et al.

(10) Patent No.: US 9,730,360 B2
(45) Date of Patent: Aug. 8, 2017

(54) SHROUD FOR AN ELECTRICAL ENCLOSURE

(71) Applicants: Joseph Michael Manahan, Manlius, NY (US); Graig E. DeCarr, Cicero, NY (US); Hans D. Haselbacher, Cicero, NY (US)

(72) Inventors: Joseph Michael Manahan, Manlius, NY (US); Graig E. DeCarr, Cicero, NY (US); Hans D. Haselbacher, Cicero, NY (US)

(73) Assignee: Cooper Technologies Company, Houston, TX (US)

( * ) Notice: Subject to any disclaimer, the term of this patent is extended or adjusted under 35 U.S.C. 154(b) by 795 days.

(21) Appl. No.: 13/689,571

(22) Filed: Nov. 29, 2012

(65) Prior Publication Data

US 2013/0137358 A1    May 30, 2013

Related U.S. Application Data

(60) Provisional application No. 61/564,536, filed on Nov. 29, 2011.

(51) Int. Cl.
*H05K 7/20* (2006.01)
*F24F 13/20* (2006.01)
(Continued)

(52) U.S. Cl.
CPC ......... *H05K 7/20145* (2013.01); *F24F 13/20* (2013.01); *F28D 15/00* (2013.01); *H02B 1/28* (2013.01); *H02B 1/56* (2013.01)

(58) Field of Classification Search
CPC ...... H05K 7/20145; F24F 13/20; F28D 15/00; H02B 1/28
(Continued)

(56) References Cited

U.S. PATENT DOCUMENTS 3,394,645 A * 7/1968 Acker ................... H01F 27/085
                                                         454/48
3,550,058 A * 12/1970 Du Bois, Jr. .......... H01C 1/082
                                                         338/284
(Continued)

FOREIGN PATENT DOCUMENTS

| EP | 0665620 A1 * | 8/1995 | ............. H02B 1/202 |
| KR | 10-2010-0138429 | 12/2010 | |
| KR | 20-2011-0007266 | 7/2011 | |

OTHER PUBLICATIONS

"Enhanced Cooling Package Using Serpentine Walls and Counter Air Flow," IBM Technical Disclosure Bulletin, vol. 26, Issue 10A, pp. 5080-5081, NA84035080, Mar. 1, 1984.*

*Primary Examiner* — Alissa Tompkins
*Assistant Examiner* — Phillip E Decker
(74) *Attorney, Agent, or Firm* — King & Spalding LLP

(57) ABSTRACT

A shroud that includes a body, a cavity, a curved outlet, and at least one non-linear channel. The body can have a top end and a bottom surface, as well as a first end and a second end located opposite the first end. The cavity can be located under the top end of the body and disposed toward the first end. The curved outlet can be disposed toward the second end of the body and have a banana-shaped vent that traverses at least two sides of the body. Each linear channel can include a bent passage, a third end, and a fourth end, where the third end adjoins the cavity, and where the fourth end adjoins a portion of the banana-shaped vent of the curved outlet. The curved outlet and the at least one non-linear channel can prevent substantially all liquids and solids outside the body from entering the cavity.

20 Claims, 8 Drawing Sheets

(51) Int. Cl.
  *F28D 15/00* (2006.01)
  *H02B 1/28* (2006.01)
  *H02B 1/56* (2006.01)

(58) Field of Classification Search
  USPC .......................... 454/184, 368; 165/104.34
  See application file for complete search history.

(56) References Cited

U.S. PATENT DOCUMENTS

| | | | |
|---|---|---|---|
| 4,180,177 A | | 12/1979 | Gunderman et al. |
| 5,277,656 A | * | 1/1994 | Koukal .................. B62D 25/12 454/147 |
| 5,775,051 A | * | 7/1998 | Nicolai .................... H02B 1/28 52/281 |
| 5,852,547 A | | 12/1998 | Kitlas et al. |
| 6,313,399 B1 | * | 11/2001 | Suntio .................. H01L 23/367 174/16.3 |
| 6,364,009 B1 | * | 4/2002 | MacManus et al. .......... 165/185 |
| 6,374,905 B1 | * | 4/2002 | Tantoush ..................... 165/80.3 |
| 6,643,130 B1 | * | 11/2003 | DeMarchis et al. .......... 361/695 |
| 6,657,861 B2 | * | 12/2003 | Irmer ..................... H02B 1/50 174/383 |
| 6,661,665 B2 | * | 12/2003 | Tantoush et al. ............. 361/719 |
| 6,698,511 B2 | * | 3/2004 | DiBene, II .......... H01L 23/3672 165/185 |
| 6,742,583 B2 | * | 6/2004 | Tikka .................... H05K 7/206 165/261 |
| 6,822,863 B1 | | 11/2004 | Artman et al. |
| 6,840,629 B2 | * | 1/2005 | Suzuki .................. G03B 21/16 353/119 |
| 6,974,379 B2 | | 12/2005 | Koessler |
| 7,256,996 B2 | * | 8/2007 | Egbert ............... H05K 7/20154 165/185 |
| 7,310,228 B2 | * | 12/2007 | Chen ............................. 361/695 |
| 7,379,298 B2 | * | 5/2008 | Walsh et al. .................. 361/692 |
| 7,382,616 B2 | | 6/2008 | Stefanoski |
| 7,408,773 B2 | | 8/2008 | Wobig et al. |
| 7,423,872 B2 | | 9/2008 | Chen |
| 7,508,664 B2 | * | 3/2009 | Holland ........................ 361/695 |
| 7,817,419 B2 | * | 10/2010 | Illerhaus .................. H02J 7/35 165/104.33 |
| 8,944,896 B2 | * | 2/2015 | Womac et al. ............... 454/184 |
| 2001/0054493 A1 | | 12/2001 | Hatanaka |
| 2002/0046853 A1 | * | 4/2002 | Stendardo ............... H01F 27/02 174/50.5 |
| 2004/0065432 A1 | * | 4/2004 | Smith et al. .................. 165/80.2 |
| 2006/0099540 A1 | * | 5/2006 | Avelar .................... F21S 13/00 431/35 |
| 2008/0068796 A1 | | 3/2008 | Pav et al. |
| 2008/0137296 A1 | * | 6/2008 | DuQuette et al. ............ 361/695 |
| 2008/0253087 A1 | | 10/2008 | Refai-Ahmed et al. |
| 2009/0081940 A1 | | 3/2009 | Jang et al. |
| 2009/0088066 A1 | * | 4/2009 | Zuzek et al. .................. 454/184 |
| 2009/0137197 A1 | | 5/2009 | Jang et al. |
| 2010/0273034 A1 | * | 10/2010 | Hermann ................ H01M 2/08 429/62 |
| 2010/0284150 A1 | * | 11/2010 | Manahan ............... H02K 5/136 361/695 |
| 2011/0053483 A1 | * | 3/2011 | Ritzer et al. .................... 454/61 |
| 2011/0109883 A1 | * | 5/2011 | Ito ......................... F16M 11/10 353/61 |
| 2013/0044430 A1 | * | 2/2013 | Carl, Jr. .............. H05K 7/20772 361/695 |
| 2013/0050942 A1 | * | 2/2013 | Konishi ............... H05K 7/20145 361/692 |
| 2015/0093985 A1 | * | 4/2015 | Towner ................... F24F 13/20 454/363 |

* cited by examiner

SHROUD FOR AN ELECTRICAL ENCLOSURE

CROSS-REFERENCE TO RELATED APPLICATIONS

This application claims priority under 35 U.S.C. §119 to U.S. Provisional Patent Application Ser. No. 61/564,536, titled "Shroud for an Explosion-Proof Enclosure" and filed on Nov. 29, 2011, the entire contents of which are hereby incorporated herein by reference.

In addition, the present application is related to the following previously filed applications: U.S. patent application Ser. No. 13/331,331 entitled "Controlling Airflow Within an Explosion-Proof Enclosure" in the names of Joseph Michael Manahan and Graig E. DeCarr (the "331 Application") and U.S. patent application Ser. No. 13/331,424 entitled "Manifold for Controlling Airflow Within an Explosion-Proof Enclosure" in the names of Joseph Michael Manahan and Graig E. DeCarr (the "424 Application"), the entire contents of which are hereby incorporated herein by reference.

TECHNICAL FIELD

The present disclosure relates generally to a shroud for an electrical enclosure, and more particularly, to a shroud for an explosion-proof enclosure.

BACKGROUND

At times, electrical enclosures have one or more apertures that traverse a surface of the electrical enclosure. Such apertures can be used for ventilation. In such a case, moisture, dirt, and other elements can enter the electrical enclosure. When such elements enter the electrical enclosure, components inside the electrical enclosure can fail and/or an adverse condition (e.g., ground fault, arcing, explosion) can occur because of the effects caused by the elements. For example, when moisture and/or water enter the electrical enclosure, wires and other metal can corrode, causing ground faults, open circuits, arcing, heat energy, and/or a number of other adverse conditions. As another example, dirt and dust can coat certain mechanical components (e.g., relay contacts) and interfere with the operation of such components. As a result of these adverse conditions caused by elements that enter an electrical enclosure through the apertures in the electrical enclosure, a covering can be used to reduce or eliminate the amount and/or types of elements that can enter the electrical enclosure through the apertures. One such covering can be called a shroud.

SUMMARY

In general, in one aspect, the disclosure relates to a shroud. The shroud can include a body having a top end and a bottom surface, where the body has a first end and a second end located opposite the first end. The shroud can also include a cavity under the top end of the body and disposed toward the first end. The shroud can further include a curved outlet disposed toward the second end of the body and having a banana-shaped vent that traverses at least two sides of the body. The shroud can also include at least one non-linear channel, where each of the at least one non-linear channels has a bent passage, a third end, and a fourth end, where the third end adjoins the cavity, and where the fourth end adjoins a portion of the banana-shaped vent of the curved outlet. The curved outlet and the at least one non-linear channel can prevent substantially all liquids and solids outside the body from entering the cavity.

In another aspect, the disclosure can generally relate to a system. The system can include an enclosure comprising a back wall and at least one side wall surrounding an interior. The system can also include an air moving device disposed within the interior of the enclosure and having an inlet end and an exhaust end. The system can further include a manifold disposed within the interior and have an inlet and an outlet, where the inlet is mechanically coupled to the exhaust end of the air moving device, and where the outlet is mechanically coupled to the at least one side wall of the enclosure. The system can also include an exhaust air filter assembly coupled to an aperture in the at least one side wall of the enclosure and disposed within the outlet of the manifold. The system can further include a shroud mechanically coupled to an outer surface of the enclosure. The shroud of the system can include a body having a top end and a bottom surface for mating to the outer surface of the enclosure, where the body has a first end and a second end located opposite the first end. The shroud of the system can also include a cavity under the top end of the body disposed toward the first end. The shroud of the system can further include a curved outlet disposed toward the second end of the body and having a banana-shaped vent that traverses at least two sides of the body. The shroud of the system can also include at least one non-linear channel, where each of the at least one non-linear channels has a bent passage, a third end, and a fourth end, where the third end adjoins the cavity, and where the fourth end adjoins a portion of the banana-shaped vent of the curved outlet. The curved outlet and the at least one non-linear channel can prevent substantially all liquids and solids outside the body from entering the cavity while allowing exhaust air from inside the enclosure to vent outside the body of the shroud.

In yet another aspect, the disclosure can generally relate to a method for passing exhaust air out of an explosion-proof enclosure. The method can include receiving, in a cavity, the exhaust air through an aperture in the explosion-proof enclosure. The method can also include channeling the exhaust air from the cavity through a non-linear channel. The method can further include channeling the exhaust air from the non-linear channel to a banana-shaped vent of a curved outlet. The method can also include channeling the exhaust air from the banana-shaped vent of the curved outlet to an end of the curved outlet. The exhaust air can exit the end of the curved outlet to the atmosphere. The curved outlet and the channel can be configured to prevent substantially all liquids and solids outside the explosion-proof enclosure from entering the cavity.

These and other aspects, objects, features, and embodiments will be apparent from the following description and the appended claims.

BRIEF DESCRIPTION OF THE DRAWINGS

The drawings illustrate only exemplary embodiments of shrouds for an electrical enclosure and are therefore not to be considered limiting of its scope, as the shrouds for an electrical enclosure may admit to other equally effective embodiments. The elements and features shown in the drawings are not necessarily to scale, emphasis instead being placed upon clearly illustrating the principles of the exemplary embodiments. Additionally, certain dimensions or positionings may be exaggerated to help visually convey such principles. In the drawings, reference numerals designate like or corresponding, but not necessarily identical, elements.

DETAILED DESCRIPTION OF EXEMPLARY EMBODIMENTS

Figure 1:
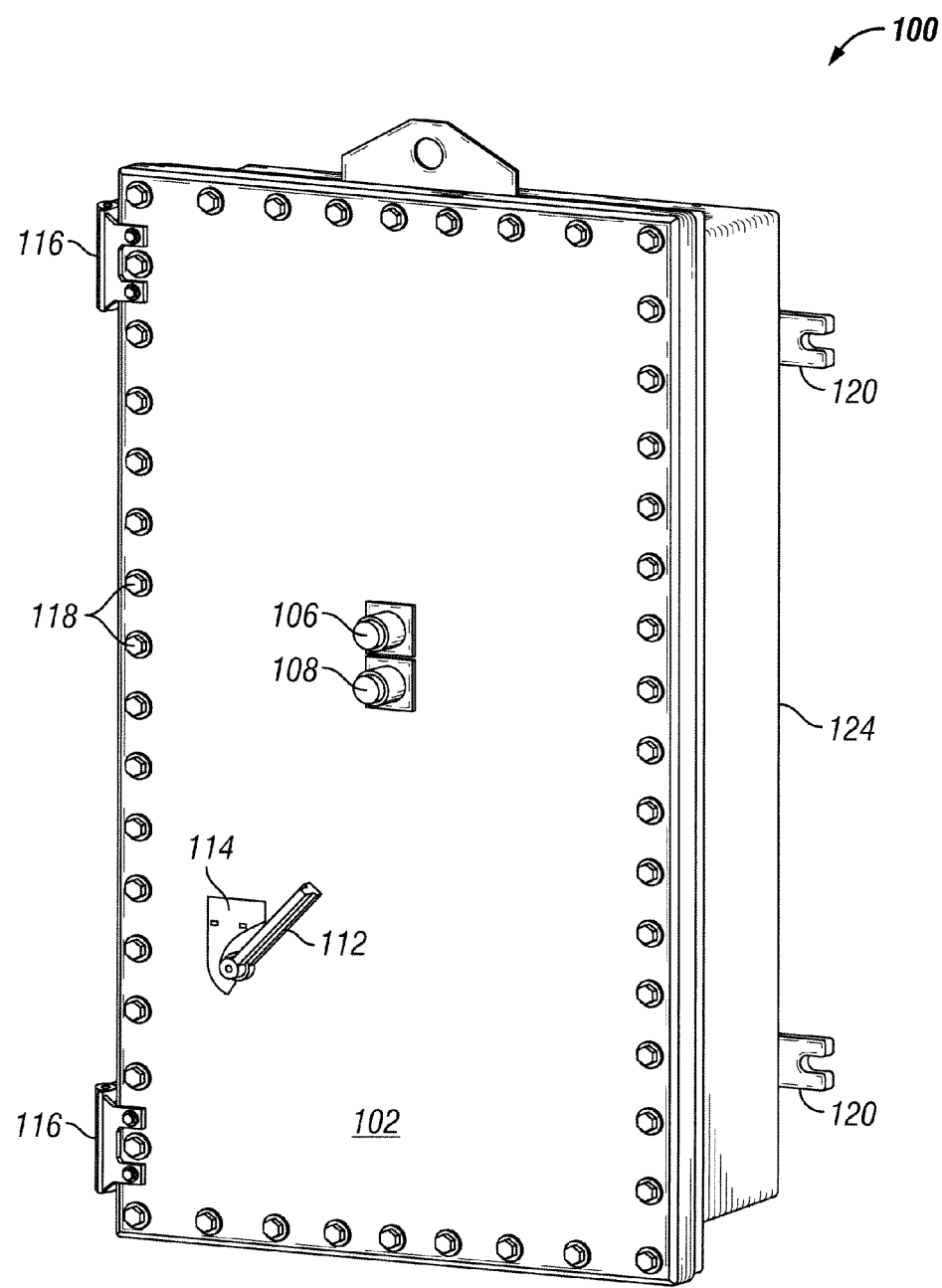
FIG. 1 shows a front perspective view of the exterior of an explosion-proof enclosure in which one or more exemplary embodiments can be implemented.

Exemplary embodiments of a shroud for an electrical enclosure will now be described in detail with reference to the accompanying figures. Like elements in the various figures are denoted by like reference numerals for consistency.

In the following detailed description of exemplary embodiments of a shroud for an electrical enclosure, numerous specific details are set forth in order to provide a more thorough understanding of a shroud for an electrical enclosure. However, it will be apparent to one of ordinary skill in the art that a shroud for an electrical enclosure may be practiced without these specific details. In other instances, well-known features have not been described in detail to avoid unnecessarily complicating the description. Further, certain descriptions (e.g., top, bottom, side, end, interior, inside) are merely intended to help clarify aspects of a shroud for an electrical enclosure and are not meant to limit embodiments of a shroud for an electrical enclosure.

In general, exemplary embodiments of a shroud for an electrical enclosure provide systems, methods, and devices for using a shroud to receive exhaust air from an electrical enclosure and channeling the exhaust air outside of the electrical enclosure. In addition, the shroud prevents substantially all liquids and solids from entering the electrical enclosure through the shroud from outside the electrical enclosure. Specifically, exemplary embodiments of a shroud for an electrical enclosure provide for abutting against an outer wall of the explosion-proof enclosure, where a positive pressure inside the electrical enclosure is used to induce the air to flow through the channels of the shroud and out of the electrical enclosure.

For example, the exemplary shroud can be coupled to an electrical enclosure that is located outdoors and prevents substantially all water (e.g., salt water, rain water) and dust from entering the electrical enclosure. Examples of such outdoor locations can include, but are not limited to, an offshore exploration platform, an offshore production platform, a substation, a power plant, an oil refinery, and a chemical plant. As another example, the exemplary shroud can be coupled to an electrical enclosure, regardless of location, that is subject to being struck by water from a hose and prevent substantially all water from entering the electrical enclosure. As yet another example, the exemplary shroud can be coupled to an electrical enclosure that is located in an unclean indoor environment and prevent substantially all solids (e.g., coal dust, dirt, paper debris, wood debris) from entering the electrical enclosure. Examples of such unclean indoor environments can include, but are not limited to, a coal handling facility, a mine, a pulp and paper plant, a steel mill, a wood processing plant, and a chemical plant.

The exemplary embodiments discussed herein are with reference to electrical enclosures. An electrical enclosure can be an explosion-proof enclosure, a non-explosion-proof enclosure (e.g., a junction box, a control panel, a lighting panel, a motor control center, a switchgear cabinet, a relay cabinet), or any other type of enclosure may be used in conjunction with exemplary embodiments of a shroud. The term "explosion-proof enclosure" as used herein can mean any type of electrical enclosure, whether explosion-proof or not.

A user may be any person that interacts with the electrical enclosure or equipment controlled by one or more components of the electrical enclosure. Specifically, a user may program, operate, and/or interface with one or more components (e.g., an air moving device controller, a variable frequency drive (VFD)) associated with a shroud for an electrical enclosure. Examples of a user may include, but are not limited to, an engineer, an electrician, an instrumentation and controls technician, a mechanic, an operator, a consultant, a contractor, and a manufacturer's representative.

In one or more exemplary embodiments, heat-generating components (discussed below) inside the electrical enclosure are any components that produce heat energy during operation. Such a component may include, but is not limited to, one or more of a device (e.g., VFD, sensor, control panel, circuit board, relay), a terminal, cable, wiring, a switch, a handle, an indicating light, a duct, and conduit.

In one or more exemplary embodiments, an electrical enclosure that is an explosion-proof enclosure (also known as a flame-proof enclosure) can contain an explosion that originates inside the enclosure. Further, the explosion-proof enclosure is configured to allow gases from inside the enclosure to escape across joints of the enclosure and cool as the gases exit the explosion-proof enclosure. The joints are also known as flame paths and exist where two surfaces meet and provide a path, from inside the explosion-proof enclosure to outside the explosion-proof enclosure, along which one or more gases may travel. A joint may be a mating of any two or more surfaces. Each surface may be any type of surface, including but not limited to a flat surface, a threaded surface, a porous surface, and a serrated surface.

In one or more exemplary embodiments, an explosion-proof enclosure is subject to meeting certain standards and/or requirements. For example, the National Electrical Manufactures Association (NEMA) sets standards by which an enclosure must comply in order to qualify as an explosion-proof enclosure. Specifically, NEMA Type 7, Type 8, Type 9, and Type 10 enclosures set standards by which an explosion-proof enclosure within a hazardous location must comply. For example, a NEMA Type 7 standard applies to enclosures constructed for indoor use in certain hazardous locations. Hazardous locations may be defined by one or more of a number of authorities, including but not limited to the National Electric Code (e.g., Class 1, Division I) and Underwriters' Laboratories, Inc. (e.g., UL 698). For example, a Class 1 hazardous area under the National Electric Code is an area in which flammable gases or vapors may be present in the air in sufficient quantities to be explosive.

As a specific example, NEMA standards for an explosion-proof enclosure of a certain size or range of sizes may require that in a Group B, Division 1 area, any flame path of an explosion-proof enclosure must be at least 1 inch long (continuous and without interruption), and the gap between the surfaces cannot exceed 0.0015 inches. Standards created and maintained by NEMA may be found at www.nema.org/stds and are hereby incorporated by reference.

FIG. 1 shows a front perspective view of the exterior of an explosion-proof enclosure 100 in which one or more exemplary embodiments can be implemented. In one or more exemplary embodiments, one or more of the components shown in FIG. 1 may be omitted, repeated, and/or substituted. Accordingly, exemplary embodiments of an explosion-proof enclosure should not be considered limited to the specific arrangements of components shown in FIG. 1.

Referring now to FIG. 1, an example of an explosion-proof enclosure 100 in a closed position (i.e., the enclosure cover 102 is secured to the enclosure body 124) is shown. The enclosure cover 102 can be secured to the enclosure body 124 by a number of fastening devices 118 located at a number of points around the perimeter of the enclosure cover 102. In one or more exemplary embodiments, a fastening device 118 may be one or more of a number of fastening devices, including but not limited to a bolt (which may be coupled with a nut), a screw (which may be coupled with a nut), and a clamp. In addition, one or more hinges 116 are secured to one side of the enclosure cover 102 and a corresponding side of the enclosure body 124 so that, when all of the fastening devices 118 are removed, the enclosure cover 102 may swing outward (i.e., an open position) from the enclosure body 124 using the one or more hinges 116. In one or more exemplary embodiments, there are no hinges, and the enclosure cover 102 is separated from the enclosure body 124 when all of the fastening devices 118 are removed.

The enclosure cover 102 and the enclosure body 124 may be made of any suitable material, including metal (e.g., alloy, stainless steel), plastic, some other material, or any combination thereof. The enclosure cover 102 and the enclosure body 124 may be made of the same material or different materials.

In one or more exemplary embodiments, on the end of the enclosure body 124 opposite the enclosure cover 102, one or more mounting brackets 120 are affixed to the exterior of the enclosure body 124 to facilitate mounting the enclosure 100. Using the mounting brackets 120, the enclosure 100 may be mounted to one or more of a number of surfaces and/or elements, including but not limited to a wall, a control cabinet, a cement block, an I-beam, and a U-bracket.

The enclosure cover 102 may include one or more features that allow for user interaction while the enclosure 100 is sealed in the closed position. As shown in FIG. 1, one or more indicating lights (e.g., indicating light 1 106, indicting light 2 108) may be located on the enclosure cover 102. Each indicating light may be used to indicate a status of a feature or process associated with equipment inside the enclosure 100. For example, an indicating light may show a constant green light if a motor controlled by a VFD inside the enclosure 100 is operating. As another example, an indicating light may flash red when a motor controlled by a VFD inside the enclosure 100 has a problem (e.g., tripped circuit, VFD overheats, overcurrent situation). As another example, an indicating light may show a constant red light when an electromagnetic pulse caused by an explosion inside the enclosure 100 has resulted. An indicating light may be made of one or more materials (e.g., glass, plastic) using one or more different lighting sources (e.g., light-emitting diode (LED), incandescent bulb).

In one or more exemplary embodiments, the enclosure cover 102 may also include a switch handle 112 that allows a user to operate a switch (not shown) located inside the explosion-proof enclosure 100 while the explosion-proof enclosure 110 is closed. Those skilled in the art will appreciate that the switch handle 112 may be used for any type of switch. Each position (e.g., OFF, ON, HOLD, RESET) of the switch may be indicated by a switch position indicator 114 positioned adjacent to the switch handle 112 on the outer surface of the enclosure cover 102. A switch associated with the switch handle 112 and the switch position indicator 114 may be used to electrically and/or mechanically isolate, and/or change the mode of operation of, one or more components inside or associated with the explosion-proof enclosure 100. For example, the switch handle 112 may point to "OFF" on the switch position indicator 114 when a disconnect switch located inside the explosion-proof enclosure 100 is disengaged. In such a case, all equipment located inside the explosion-proof enclosure 100, as well as the equipment (e.g., a motor) controlled by the equipment located inside the explosion-proof enclosure 100, may be without power.

Figure 2:
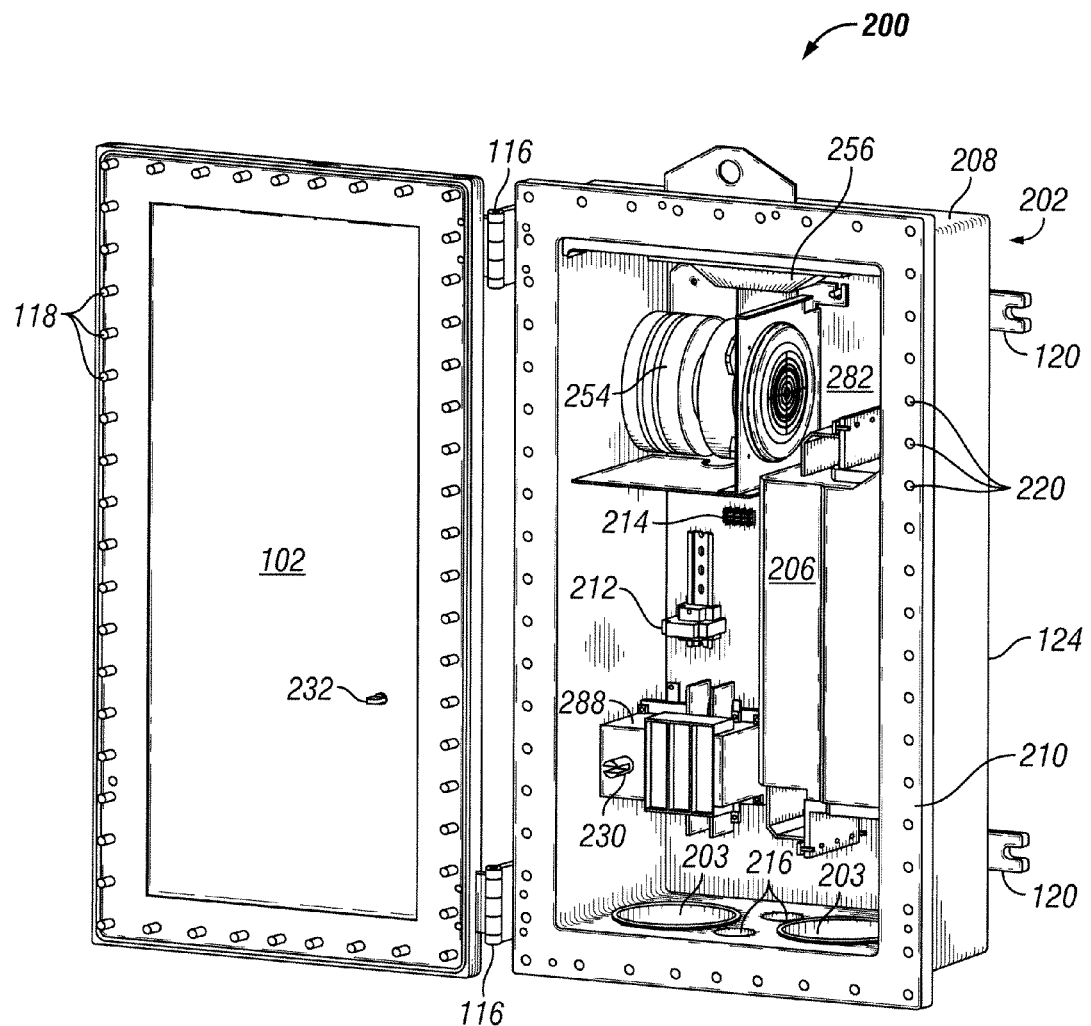
FIG. 2 shows a front perspective view of the interior of an explosion-proof enclosure in which one or more exemplary embodiments can be implemented.

FIG. 2 shows front perspective view of the interior of a system 200 that includes an explosion-proof enclosure 202 in which one or more exemplary embodiments can be implemented. Referring to FIGS. 1 and 2, the explosion-proof enclosure 202 is in the open position because the enclosure cover 102 is not secured to the enclosure body 124. The hinges 116 attached to the left side of the enclosure body 124 are also attached to the left side of the enclosure cover 102, which is swung outward from the enclosure body 124. Because the explosion-proof enclosure 202 is in the open position, the components of the explosion-proof enclosure 202 are visible to a user.

As described above with respect to FIG. 1, the enclosure body 124 includes two or more mounting brackets 120. In addition, in one or more exemplary embodiments, the enclosure body 124 includes an enclosure engagement surface 210, against which the enclosure cover 102 meets when the explosion-proof enclosure 202 is in the closed position. A number of fastening device apertures 220 are shown around the enclosure engagement surface 210, where each of the fastening device apertures 220 are configured to receive a fastening device 118 that traverses through corresponding apertures in the enclosure cover 102.

In one or more exemplary embodiments, the explosion-proof enclosure 202 of FIG. 2 includes a mounting plate 282 that is affixed to the back of the inside of the explosion-proof enclosure 202. The mounting plate 282 may be configured to receive one or more components such that the one or more components are affixed to the mounting plate 282. The mounting plate 282 may include one or more apertures configured to receive securing devices that may be used to affix a component to the mounting plate 282. The mounting plate 282 may be made of any suitable material, including but not limited to the material of the enclosure body 124. In one or more exemplary embodiments, some or all of the one or more components may be mounted directly to an inside wall of the explosion-proof enclosure 202 rather than to the mounting plate 282.

In one or more exemplary embodiments, a VFD 206 is affixed to the mounting plate 282 inside the explosion-proof enclosure 202. The VFD 206 may include any components used to drive a motor and/or other device using variable control signals for controlled starts, stops, and/or operations of the motor and/or other devices. Examples of components of a VFD 206 include, but are not limited to, discrete relays, a programmable logic controller (PLC), a programmable logic relay (PLR), an uninterruptible power supply (UPS), and a distributed control system (DCS). In one or more exemplary embodiments, one or more components of the VFD 206 may replace the VFD 206. For example, the VFD 206 may be substituted by one or more PLCs, one or more PLRs, one or more UPSs, one or more DCSs, and/or other heat-generating components.

In one or more exemplary embodiments, a switch 288 is affixed to the mounting plate 282 inside the explosion-proof enclosure 202. The switch 288 may be configured to electrically and/or mechanically isolate, and/or change the mode of operation of, one or more components located inside the explosion-proof enclosure 202 and/or one or more components located outside the explosion-proof enclosure 202. The switch 288 may be any type of switch, including but not limited to a disconnect switch, a test switch, a reset switch, an indicator switch, and a relay switch. For example, the switch 288 may be a disconnect switch that is used to cut off power to all components in the explosion-proof enclosure 202 and all devices located outside the explosion-proof enclosure 202 that are controlled by the components inside the explosion-proof enclosure 202. As another example, the switch 288 may be a bypass switch that is used to deactivate a protection scheme (e.g., a relay) or some other particular component or group of components located inside the explosion-proof enclosure 202.

The switch 288 may further be configured to receive, through mechanical and/or electrical means, a directive to change states (e.g., open, closed, hold) from a component located on the enclosure cover. For example, if the enclosure 202 cover includes a switch handle 112 (as described above with respect to FIG. 1), then a switch handle shaft 232 may extend from the switch handle 112 through the enclosure cover 102 to a switch coupling 230 of the switch 288. When the explosion-proof enclosure 202 is in the closed position, the switch handle shaft 232 couples with the switch coupling 230, and the switch 288 may be operated by operating the switch handle 112 located outside the explosion-proof enclosure 202, as described above with respect to FIG. 1.

In one or more exemplary embodiments, one or more relays (e.g., relay 212) are affixed to the mounting plate 282 inside the explosion-proof enclosure 202. A relay 212 may be configured to control one or more operations of one or more components located in, or associated with, the explosion-proof enclosure 202. Specifically, a relay 212 may, through one or more relay contacts, allow electrical current to flow and/or stop electrical current from flowing to one or more components in the enclosure 202 based on whether a coil of the relay 212 is energized or not. For example, if the coil of the relay 212 is energized, then a contact on the relay may be closed to allow current to flow to energize a motor. The relay 212 may be activated based on a timer, a current, a voltage, some other suitable activation method, or any combination thereof. The relay 212 may also be configured to emit a signal when a condition has occurred. For example, the relay 212 may flash a red light to indicate that the VFD 206 is in an alarm state.

In one or more exemplary embodiments, wiring terminals 214 are affixed to the mounting plate 282 inside the explosion-proof enclosure 202. Wiring terminals 214 are a series of terminals where one terminal is electrically connected to at least one other terminal in the series of terminals while remaining electrically isolated from the remaining terminals in the series of terminals. In other words, two or more terminals among the series of terminals act as a junction point where multiple wires may be electrically connected through the joined terminals.

In one or more exemplary embodiments, one or more entry holes 216 may extend through one or more sides (e.g., bottom) of the enclosure body 124. Each entry hole 216 may be configured to allow cables and/or wiring for power, control, and/or communications to pass through from outside the explosion-proof enclosure 202 to one or more components inside the explosion-proof enclosure 202. An entry hole 216 may be joined with a conduit and coupling from outside the explosion-proof enclosure 202 to protect the cables and/or wiring received by the entry hole 216 and to help maintain the integrity of the explosion-proof enclosure 202 through the entry hole 216.

FIG. 2 also includes an air moving device 254 that is positioned within the interior of the explosion-proof enclosure 202. The air moving device 254 may be a blower, a fan, or some similar device that is configured to move air. The air moving device 254 may include a motor that is used to control the flow of air (e.g., exhaust air) within the explosion-proof enclosure 202. The air moving device 254 may be configured to move air inside the explosion-proof enclosure 202. Specifically, the air moving device 254 may be configured to feed exhaust air from within the explosion-proof enclosure 202 into the manifold 256. The air moving device 254 may drive a differential pressure within the interior of the explosion-proof enclosure 202 to create the air flow. More than one air moving device 254 may be located and/or operating within the explosion-proof enclosure 202.

The exhaust air may be any air inside the explosion-proof enclosure 202. For example, the exhaust may be air that is used to cool heat-generating components (e.g., VFD, switch) located inside the explosion-proof enclosure 202. The exhaust air may originate as intake air. The air moving device 254 may draw intake air from outside the explosion-proof enclosure 202 through one or more intake apertures 203 in the explosion-proof enclosure 202. In one or more exemplary embodiments, the intake apertures 203 are incorporated with one or more air intake filter assemblies. Specifically, the air intake filter assembly may be coupled to an intake aperture 203 in a wall of the explosion-proof enclosure 202.

In such a case, as the air moving device 254 passes the intake air over the one or more heat-generating components, the intake air cools the heat-generating components. As the heat-generating components are cooled, the temperature of the intake air increases to generate exhaust air. In other words, the temperature of the exhaust air is greater than the temperature of the intake air. In one or more exemplary embodiments, the air moving device 254 is further configured to move the exhaust air into the manifold 256.

In one or more exemplary embodiments, the air moving device 254 operates continuously. Alternatively, the air moving device 254 may operate on a periodic basis. The periodic basis may be random, at a fixed interval, based on some operating parameter (e.g., the temperature inside the explosion-proof enclosure exceeds a threshold temperature), user preferences, some other suitable factor, or any combination thereof. The operation of the air moving device 254 may be controlled by one or more of a number of sources, including but not limited to a user (through manual operation) and an air moving device controller (not shown).

In one or more exemplary embodiments, the manifold 256 is coupled to the air moving device 254 (or each air moving device 254 if there are multiple air moving devices). The manifold 256 may be coupled to the air moving device 254 in one or more of any number of manners, including but not limited to using mating threads, bolting, welding, using epoxy, brazing, press fitting, mechanically connecting, using a flat joint, and using a serrated joint. The manifold 256 may be configured to direct some or all of the exhaust air outside the explosion-proof enclosure 202. The manifold 256 may form a seal between the air moving device 254 and a portion of the inner surface of an outer wall of the explosion-proof enclosure 202. By forming a seal, the manifold 256 may create and/or maintain a differential pressure (e.g., a positive pressure) to create air flow to remove the exhaust air from the explosion-proof enclosure 202.

The exhaust air inside the manifold 256 may exit the interior of the explosion-proof enclosure 202 through one or more outlet apertures in an outer wall of the explosion-proof enclosure 202. In one or more exemplary embodiments, each outlet aperture extends through one or more sides (e.g., bottom) of the outer wall of the explosion-proof enclosure 202. Each outlet aperture may be configured to couple to an exhaust air filter assembly (described below with respect to FIG. 3) according to the configurations of the exhaust air filter assembly. For example, if an exhaust air filter assembly has a threaded body, then the outlet aperture may be configured to have corresponding threads that mate with the threads of the exhaust air filter assembly.

Figure 3:
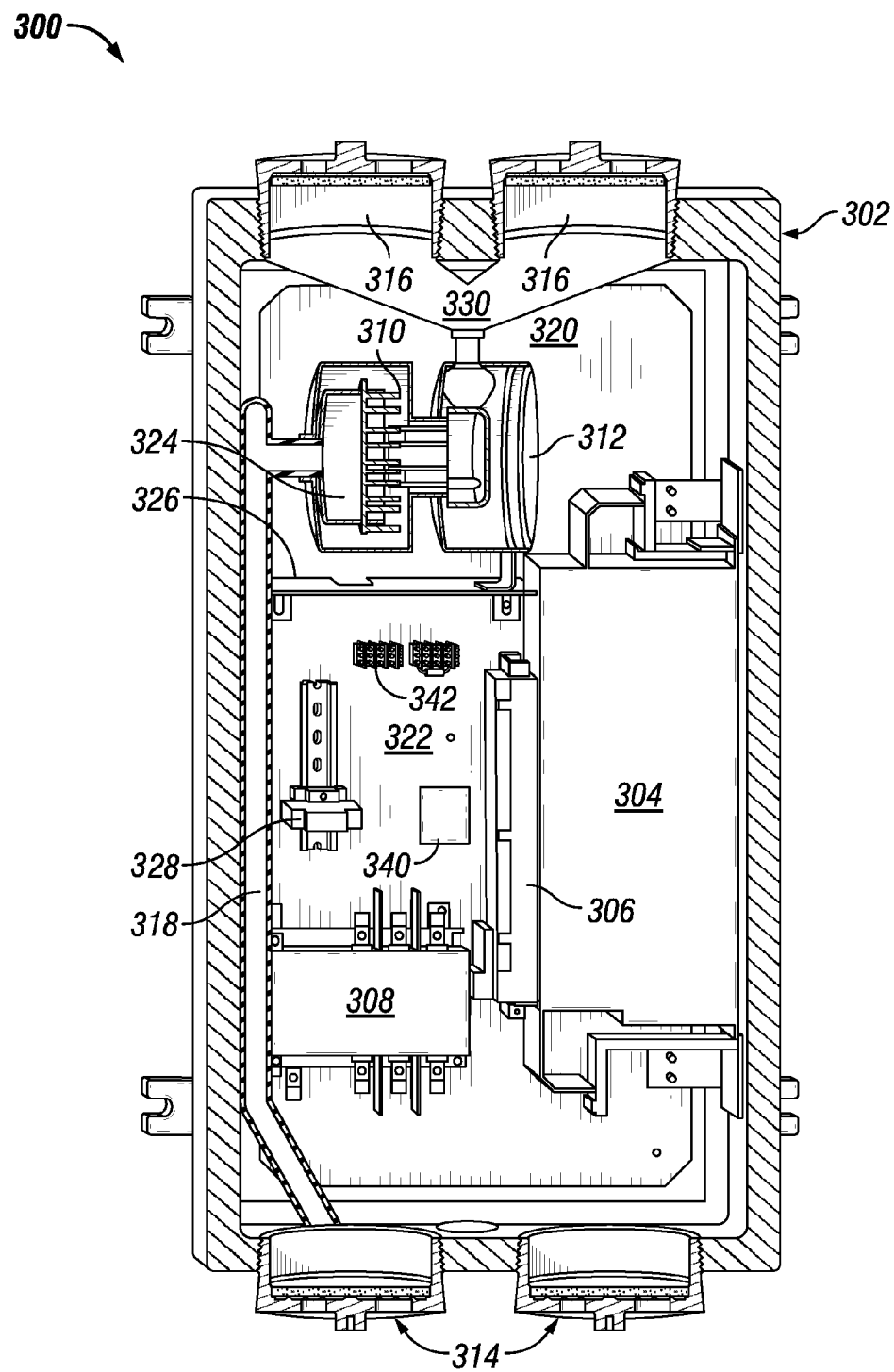
FIG. 3 shows a frontal view of the interior of another explosion-proof enclosure in which one or more exemplary embodiments can be implemented.

FIG. 3 shows a frontal view of the interior of a system 300 that includes another explosion-proof enclosure 302 in which one or more exemplary embodiments can be implemented. Features shown but not described and/or labeled in FIG. 3 are described and/or labeled above with respect to FIGS. 1 and 2. In one or more exemplary embodiments, the interior of the explosion-proof enclosure 302 may be divided into two or more regions. In FIG. 3, the interior of the explosion-proof enclosure 302 is divided into a first region 320 and a second region 322. The first region 320 may have an equal or higher temperature than the second region 322 while one or more components within the interior of the explosion-proof enclosure 302 are operating. The air moving device 310 and the air moving device controller 324 shown in FIG. 3 are located in the first region 320. Further, the VFD 304 shown in FIG. 3 is located in the second region 322.

In one or more exemplary embodiments, an air moving device 310 is positioned within the interior of the explosion-proof enclosure 302. The air moving device 310 may be a blower, a fan, or some similar device that is configured to move air. The air moving device 310 may include a motor that is used to control the flow of air (e.g., exhaust air) within the explosion-proof enclosure 302. The air moving device 310 may be configured to move air inside the explosion-proof enclosure 302. Specifically, the air moving device 310 may be configured to draw intake air from outside the explosion-proof enclosure 302, move intake air and/or exhaust air within the explosion-proof enclosure 302, and/or remove exhaust air from the interior of the explosion-proof enclosure 302. The air moving device 310 may drive a differential pressure within the interior of the explosion-proof enclosure 302 to create the air flow.

The air moving device 310 may draw intake air from outside the explosion-proof enclosure 302 through one or more intake apertures in the explosion-proof enclosure 302.

In one or more exemplary embodiments, an air intake filter assembly 314 is incorporated into the one or more intake apertures in the explosion-proof enclosure 302. Specifically, the air intake filter assembly 314 may be coupled to an intake aperture in a wall of the explosion-proof enclosure 302. In one or more exemplary embodiments, the intake aperture in the wall of the explosion-proof enclosure 302 is located in, or adjacent to, the second region 322 of the interior of the explosion-proof enclosure 302.

In one or more exemplary embodiments, the air intake filter assembly 314 is configured to remove contaminants from the intake air as the intake air passes from outside the explosion-proof enclosure 302 to the interior of the explosion-proof enclosure 302. The air intake filter assembly 314 may also be configured to cool the intake air as the intake air passes from outside the explosion-proof enclosure 302 to the interior of the explosion-proof enclosure 302. The air intake filter assembly 314 (and its components) may be coupled to the explosion-proof enclosure 302 in such a way, and assembled in such a way, as to meet the standards required for an explosion-proof enclosure. The air intake filter assembly 314 may include a sintered filter.

In one or more exemplary embodiments, the air intake filter assembly 314 includes one or more other components (e.g., a heat exchanger, copper mesh) may be coupled to the air intake filter assembly 314 to help cool the intake air. For example, the air intake filter assembly 314 may include a heat exchanger for cooling the intake air. As another example, the air intake filter assembly 314 may include a thermoelectric cooler for cooling the intake air.

Each air intake filter assembly 314 may be configured in one of a number of different ways. In one or more exemplary embodiments, the air intake filter assembly 314 is configured to include at least one cavity, where a filter (e.g., sintered material) couples to each cavity. In exemplary embodiments where the air intake filter assembly 314 includes multiple cavities, more air flow (i.e., a higher rate of air flowing per unit time) may be possible compared to an air intake filter assembly 314 with only a single cavity. Each filter of the air intake filter assembly 314 may be configured to remove contaminants from the intake air as the intake air passes through the filter to the interior of the explosion-proof enclosure 302. Each filter of the air intake filter assembly 314 may also be configured to cool the intake air as the intake air passes through the filter to the interior of the explosion-proof enclosure 302. Each cavity may be one of a number of shapes, including but not limited to an ellipse, a rectangle, an octagon, a triangle, and a circle.

Once the intake air is within the interior of the explosion-proof enclosure 302, the air moving device 310 is configured to pass the intake air over one or more heat-generating components. In one or more exemplary embodiments, one or more of the heat-generating components are located in the second region 322. For example, the air moving device 310 may pass the intake air over the VFD 304 in the second region 322 of the interior of the explosion-proof enclosure 302. The air moving device 310 may pass the intake air over the heat-generating components using a channel or intake (not shown), separate from the controller intake 318. In such a case, the channel may be positioned in the second region 322 of the interior of the explosion-proof enclosure and configured to direct the intake air toward the heat-generating components.

As the air moving device 310 passes the intake air over the one or more heat-generating components, the intake air cools the heat-generating components. As the heat-generating components are cooled, the temperature of the intake air increases to generate exhaust air. In other words, the temperature of the exhaust air is greater than the temperature of the intake air. In one or more exemplary embodiments, the air moving device 310 is further configured to remove the exhaust air from the interior of the explosion-proof enclosure 302.

In one or more exemplary embodiments, the air moving device 310 operates continuously. Alternatively, the air moving device 310 may operate on a periodic basis. The periodic basis may be random, at a fixed interval, based on some operating parameter (e.g., the temperature inside the explosion-proof enclosure exceeds a threshold temperature), user preferences, some other suitable factor, or any combination thereof. The operation of the air moving device 310 may be controlled by one or more of a number of sources, including but not limited to a user (through manual operation) and an air moving device controller 324.

In one or more exemplary embodiments, the air moving device 310 (with or without the air moving device controller 324, described below) also becomes a heat-generating component. In such a case, intake air (or a portion thereof) may be directed to and passed over the air moving device 310 to cool the air moving device 310. The intake air may be directed to and passed over the air moving device 310 using an airflow within the explosion-proof enclosure created by the air moving device 310. Alternatively, or in addition, the intake air may be directed to and passed over the air moving device 310 using some other means, including but not limited to a pressure differential and another air moving device.

A controller intake 318 may be used to direct intake air toward the air moving device 310 and/or the air moving device controller 324. The controller intake 318 may take the intake air from any point within or outside the explosion-proof enclosure 302, including but not limited to an aperture in the explosion-proof enclosure 302 and an intake air filter assembly 314 coupled to an aperture in the explosion-proof enclosure 302. The controller intake 318 may be made of any material (e.g., plastic, aluminum, ethylene propylene diene monomer (EPDM) rubber), any configuration, and/or of any size suitable for directing a portion of the intake air toward the air moving device 310.

As the intake air passes over the air moving device 310 and/or the air moving device controller 324, the intake air cools the air moving device 310 and/or the air moving device controller 324. As the air moving device 310 and/or the air moving device controller 324 are cooled, the temperature of the intake air increases to generate additional exhaust air. In other words, the temperature of the additional exhaust air is greater than the temperature of the intake air. In one or more exemplary embodiments, the air moving device 310 is further configured to remove the additional exhaust air from the interior of the explosion-proof enclosure 302.

In one or more exemplary embodiments, a baffle 326 is inserted within the interior of the explosion-proof enclosure 302. The baffle 326 may be configured to separate the first region (i.e., the high temperature portion of the interior of the explosion-proof enclosure 302) from the second region (i.e., the low temperature portion of the interior of the explosion-proof enclosure 302). The baffle 326 may be made of any material (e.g., metal, plastic) and in any dimensions (e.g., length, width, thickness, shape) suitable to provide a physical barrier between the first region 320 and the second region 322 within the interior of the explosion-proof enclosure 302. The baffle 326 may be positioned within the interior of the explosion-proof enclosure 302 on a side of the air moving device 310 proximate to the second region 322. In this example, the baffle 326 is positioned just below the air moving device 310 and the air moving device controller 324 to separate the first region 320 from the second region 322.

In one or more exemplary embodiments, the air moving device controller 324 is a component located within the interior of the explosion-proof enclosure 302. Specifically, in FIG. 3, the air moving device controller 324 is located in the first region 320. The air moving device controller 324 may be configured to control the operation of the air moving device 310. For example, the air moving device controller 324 may be configured to start the air moving device 310, stop the air moving device 310, and increase and/or decrease the speed at which the air moving device 310 operates.

In one or more exemplary embodiments, the air moving device controller 324 is also coupled to other components. Such other components may be located within the interior of the explosion-proof enclosure 302 and/or adjacent to the explosion-proof enclosure 302. Such other components may be, or provide information related to, the operation of the air moving device 310. Examples of such other components may include, but are not limited to, a measuring device 340 (e.g., a temperature sensor, an air flow sensor), the control board 306 (described below), and a pushbutton.

For example, the air moving device controller 324 may be coupled to a measuring device 340 configured to measure the temperature (i.e., a temperature sensor) at some point in the interior of the explosion-proof enclosure. When the temperature measured by the measuring device 340 exceeds a first threshold temperature value, the air moving device controller 324 may start the air moving device 310 and regulate the speed of the air moving device 310 until the temperature falls below a second threshold value. When the temperature at the point in the interior of the explosion-proof enclosure measured by the measuring device 340 falls below the second threshold temperature, then the air moving device controller 324 may stop the air moving device 310.

The air moving device controller 324 may be a heat-generating component. Other heat-generating components may include, but are not limited to, a VFD 304, a relay 328, a wiring terminal 342, and a switch 308, all of which are substantially similar to the corresponding components described above with respect to FIG. 2. A heat-generating component may also include a control board 306. The control board 306 may be configured to interface with the VFD 304. Specifically, the control board 306 may send signals to, and/or receive signals from, the VFD 304. The signals sent between the control board 306 and the VFD 304 may include, but are not limited to, commands, information, requests, instructions, status, and data. The control board 306 may communicate with the VFD 304 through hardwires and/or a wireless interface.

In one or more exemplary embodiments, the one or more heat-generating components generate a quantifiable amount of heat energy during operation. For example, a VFD 304 may generate 1200 watts or more of heat energy inside the explosion-proof enclosure 302. As another example, the air moving device controller 324 and/or the air moving device 310 may generate 370 watts or more of heat energy inside the explosion-proof enclosure 302. As yet another example, the switch 308 may generate 27 watts or more of heat energy inside the explosion-proof enclosure 302.

The control board 306 may also be configured to communicate with other components (e.g., switch 308, air moving device controller 324) and/or a user. Communication with a user may be conveyed directly (e.g., an indicating light or display screen mounted on the exterior of the door of the explosion-proof enclosure 302) or indirectly (e.g., sending a signal to a control room where the communication is conveyed).

In one or more exemplary embodiments, the air moving device intake 312 is coupled to the air moving device 310. The air moving device intake 312 may be configured to receive the exhaust air from the heat-generating components. Specifically, the air moving device intake 312 may be configured to draw the exhaust air from the heat-generating components (e.g., the VFD 304) toward an aperture of the explosion-proof enclosure 302. The air moving device intake 312 may include a screen, filter, and/or other similar feature to remove contaminants from the exhaust air and/or to lower the temperature of the exhaust air.

In one or more exemplary embodiments, the manifold 330 is coupled to the air moving device 310 and/or the air moving device intake 312. The manifold 330 may be configured to direct some or all of the exhaust air and the additional exhaust air (if any) outside the explosion-proof enclosure 302. The manifold 330 may form a seal between the air moving device 310 (and/or the air moving device intake 312) and the exhaust air filter assembly 316, described below. By forming a seal, the manifold 330 may create and/or maintain a differential pressure to create air flow to remove the exhaust air and/or the additional exhaust air from the explosion-proof enclosure 302.

The air moving device 310 may remove the some or all of the exhaust air and the additional exhaust air from the interior of the explosion-proof enclosure 302 through one or more outlet apertures (different from the intake apertures described above with respect to the intake air) in the explosion-proof enclosure 302. In one or more exemplary embodiments, an exhaust air filter assembly 316 is incorporated into the one or more outlet apertures in the explosion-proof enclosure 302. Specifically, the exhaust air filter assembly 316 may be coupled to an outlet aperture in a wall of the explosion-proof enclosure 302. In one or more exemplary embodiments, the outlet aperture in the wall of the explosion-proof enclosure 302 is located in, or adjacent to, the first region 320 of the interior of the explosion-proof enclosure 302. The outlet apertures and intake apertures may be one opposite walls of the explosion-proof enclosure 302.

In one or more exemplary embodiments, the exhaust air filter assembly 316 is substantially similar to the air intake filter assembly 314. Thus, the description above with respect to the air intake filter assembly 314 may also apply to the exhaust air filter assembly 316. For example, the exhaust air filter assembly 316 may be configured to allow exhaust air to pass from the interior of the explosion-proof enclosure to outside the explosion-proof enclosure. The exhaust air may have a higher temperature than the temperature of the intake air. The exhaust air filter assembly 316 may further be configured to meet and maintain the standards and requirements for an explosion-proof enclosure. For example, the exhaust air filter assembly 316 may include a sintered filter.

Figure 4:
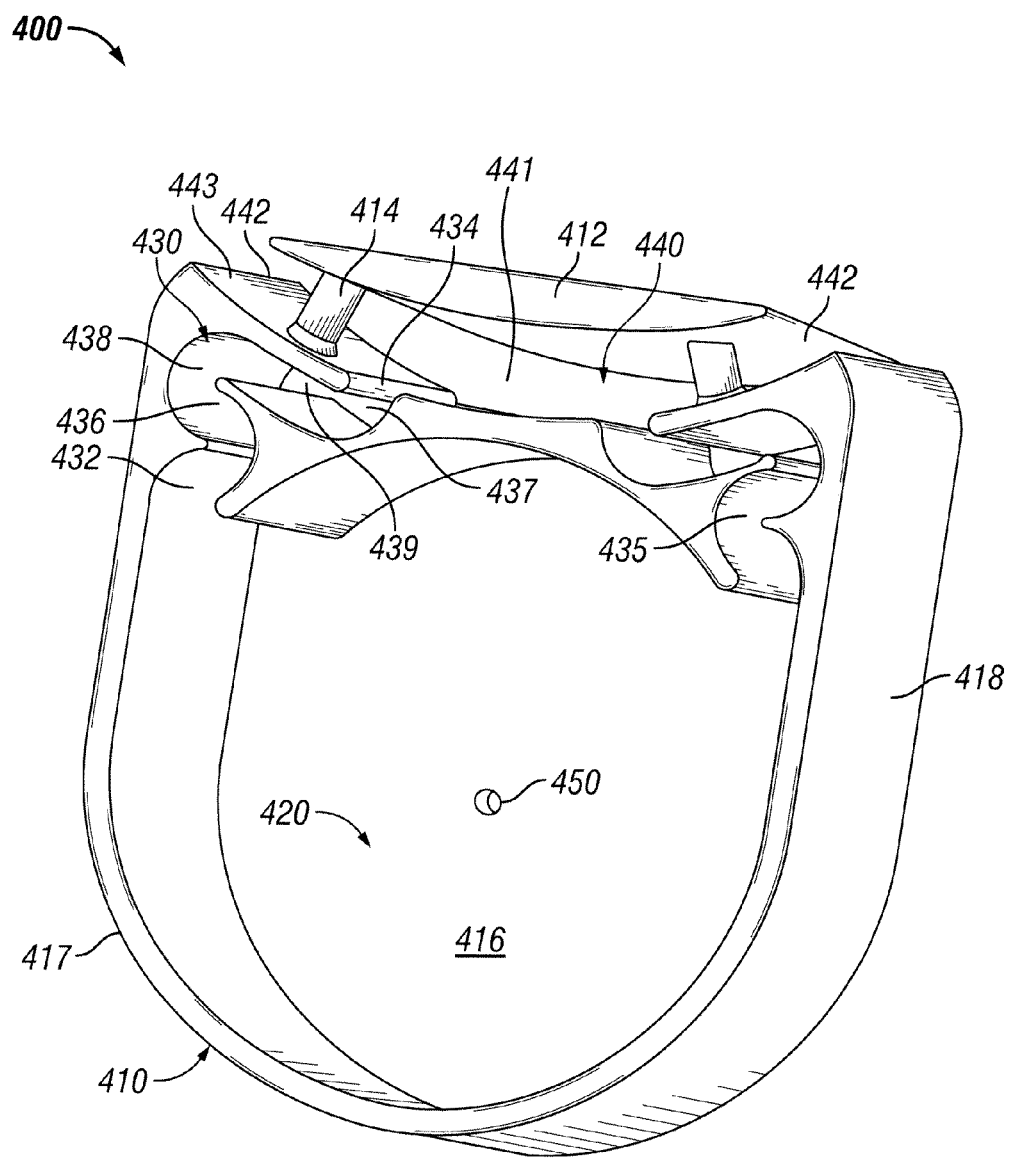
FIG. 4 shows a bottom perspective view of an exemplary shroud in accordance with one or more exemplary embodiments.

FIG. 4 shows a bottom perspective view of an exemplary shroud 400 in accordance with one or more exemplary embodiments. The shroud 400 shown in FIG. 4 includes a body 410, a cavity 420, an outlet 440, and a pair of channels 430. One or more components and/or features shown in FIG. 4 can be omitted, repeated, and/or substituted. Accordingly, embodiments of a shroud should not be considered limited to the specific arrangements of components shown in FIG. 4.

In certain exemplary embodiments, the body 410 of the shroud 400 includes a top end 416, a bottom surface 417, and one or more walls 418 that connect the top end 416 and the bottom surface 417. Referring to FIGS. 1-4, the body 410 can be made of one or more of a number of materials that are substantially resistant to liquids, solids, and at least some range of temperatures. Such materials can include, but are not limited to, stainless steel, aluminum, rubber, and nylon. The body 410 can be rigid and/or flexible.

The top end 416 can have one or more apertures 450 that traverse therethrough. As explained below, such an aperture can be used to receive a fastening device (e.g., a screw, a bolt) to secure the shroud 400 to an exhaust air filter assembly 316, the enclosure 302, or some other component in of a system 300. The surfaces of the top end 416 and/or the one or more walls 418 can be smooth and/or textured. In certain exemplary embodiments, an optional sealing member (e.g., a gasket) can be positioned within a channel along the bottom surface 417 and/or between the bottom surface 417 and the surface (e.g., the top of the enclosure) to which the shroud 400 is mechanically coupled.

In addition, or in the alternative, the body 410 can include one or more of a number of fastening devices to secure the shroud 400 to an exhaust air filter assembly 316, the enclosure 302, or another component of the system 300. Examples of such fastening devices can include, but are not limited to, a clamp, mating threads, a vacuum sealing chamber, and a compression fitting. In such a case, the shroud 400 can be removably coupled to an exhaust air filter assembly 316, the enclosure 302, or some other component in of a system 300. Alternatively, the shroud 400 can be fixedly coupled to an exhaust air filter assembly 316, the enclosure 302, or some other component in of the system 302. In such a case, the shroud 400 can be fixedly coupled using one or more of a number of coupling methods, including but not limited to welding, soldering, a living hinge, a snap fitting, a press fitting, and epoxy.

Bounded by the top end 416 and the one or more walls 418 is a cavity 420. The cavity 420 is a space that receives exhaust air from inside the enclosure 302. The cavity 420 can be positioned along any portion of the shroud 400. In this case, the cavity 420 is biased toward the bottom end, as shown in FIG. 4. Between the top end of the cavity 420 and the top end of the body 410 are positioned a pair of channels 430. Such channels 430 are also bounded by the top end 416 and, optionally, a bottom end (not shown) that is substantially parallel to the top end 416 and substantially flush with the bottom surface 417 where the channels 430 run along the top end of the body 410. In addition, or in the alternative, the optional bottom end may extend laterally inward along some or all of the bottom surface 417, substantially parallel to the top end 416, to bound the cavity 420.

The height of a channel 430 can vary. For example, when the walls of the channel 430 are substantially parallel with the one or more walls 418 of the body 410, the height of the channel 430 can be slightly less than the height of the shroud. On the other hand, if the walls of the channel 430 are not parallel with the one or more walls 418 of the body 410, the height of the channel 430 can be more or less than the height of the shroud. Further, while not shown, the channel 430 can have one or more baffles or similar dividing segments that are disposed along part or all of a channel 430. Such baffles can be substantially parallel to the top end 416 and/or be otherwise oriented within the channel 430. In addition, or in the alternative, the height of the channel 430 can vary along its length.

In certain exemplary embodiments, each channel 430 is non-linear. In other words, each channel 430 can have one of a number of non-linear or bent passages. In the example shown in FIG. 4, each channel 430 has an open end 432 that adjoins the cavity 420, followed by a bend 435 of over 90° (approximately 135°) that leads to a short, substantially straight segment 436, followed by another bend 438 of approximately 180°, followed by another substantially straight segment 439, followed by another bend 437 of approximately 90°, which forms the other end 434 of the channel 430 that adjoins the outlet 440. The open end 432 and/or the other end 434 can be segmented to have multiple openings that feed into and/or out of the channel 430.

The shroud 400 can have a single channel 430 or multiple channels 430. In this example, there are two channels 430, where each channel 430 is substantially identical to each other in shape and size, and where each channel 430 is disposed symmetrically to each other with respect to a longitudinal axis along the center of the body 410. In certain exemplary embodiments, when a shroud 400 includes multiple channels 430, each channel 430 can have different shapes and/or sizes compared to each other. In addition, or in the alternative, the channels 430 can be disposed within the body 410 randomly, symmetrically, or in some other fashion.

In certain exemplary embodiments, the outlet 440 is non-linear (e.g., curved) and includes a vent 441. As with the channels 430, the outlet 440 is formed within the body 410. In this case, the outlet 440 is bounded by the top end 416, a side wall segment 412, and an inner wall 443 that is interrupted where the ends 434 of the channels 430 adjoin the outlet 440. Optionally, the outlet 440 can be bounded by a bottom end (not shown).

The outlet 440 provides at least one outlet from the channel 430 to the ambient air outside the shroud 400. The outlet can have any of a number of shapes and/or sizes. In this example, the outlet 400 is a curved section, and the vent 441 is approximately banana-shaped and has a height that is substantially uniform along its length. As used herein, the term "banana-shaped" is used to describe a non-linear shape that is curved. Other terms can be used in place of banana-shaped, including but not limited to crescent-shaped, arc-shaped, and curved segment. The channels 430 can adjoin the vent 441 at any point along the vent 441. In this example, each of the two channels 430 adjoin the vent 441 approximately one-third of the distance from the outlet points 442 along the length of the vent 441. Optionally, one or more standoffs 414 can be disposed within the outlet 440 to maintain the structural integrity of the body 410 relative to the outlet 440.

The "banana shape" of the outlet 440 is designed such that the point in the vent 441 where the ends 434 of the non-linear channels 430 adjoin the vent 441 present a higher resistance (and thus a higher pressure) condition than the outlet points 442 of the outlet 440. As a result, substantially any solids and/or liquids that enter one of the outlet points 442 traverse through the vent 441 of the outlet 440 to the other outlet point 442 (and thus back into the atmosphere) rather than traveling, once in the vent 441, through an end 434 of a non-linear channel 430. Even if a minimal amount of solids and/or liquids travel through an end 434 of a non-linear channel 430 (rather than pass through the length of the vent 441), the non-linear shape of the non-linear channel 430 prevents much of these liquids and/or solids from passing into the cavity 420. Further, for any solids and/or liquids that reach the cavity 420, the filter of the exhaust air filter assembly 316 is raised (as shown in FIG. 6C) above the surface of the enclosure 302 within the cavity 420. Thus, substantially none of the liquids and/or solids enter the interior of the enclosure 302.

Figure 6A:
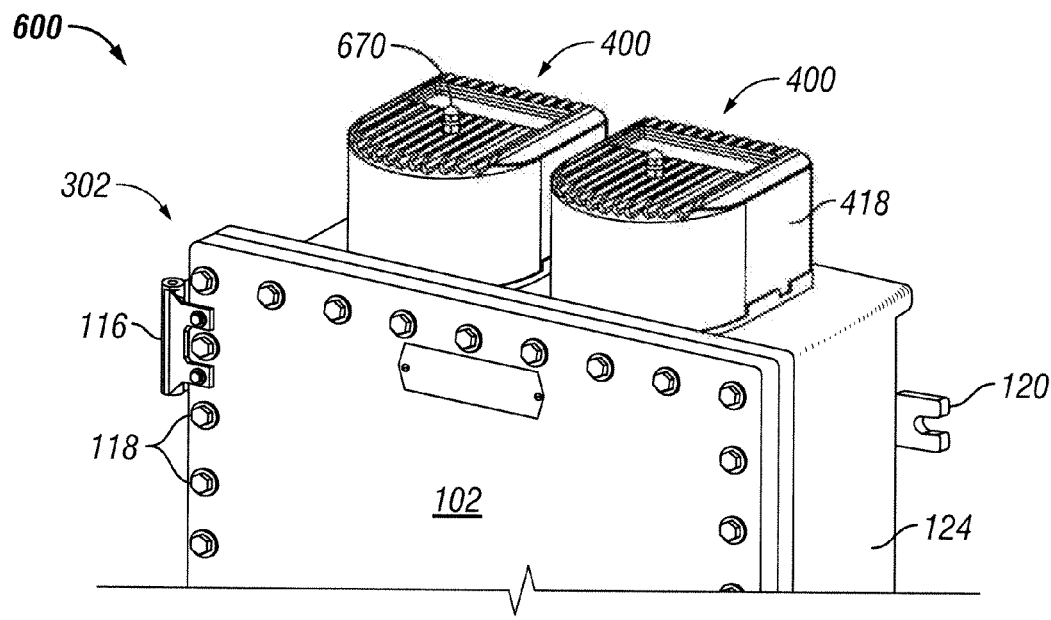
FIGS. 6A-C show various views of an enclosure system that includes an exemplary shroud in accordance with one or more exemplary embodiments.
Figure 6B:
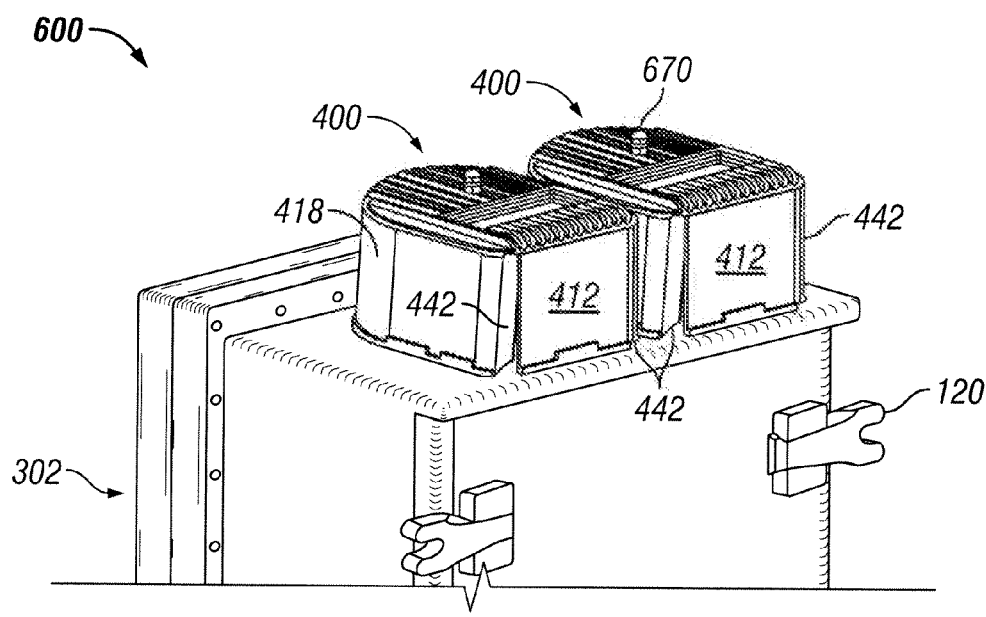
Figure 6C:
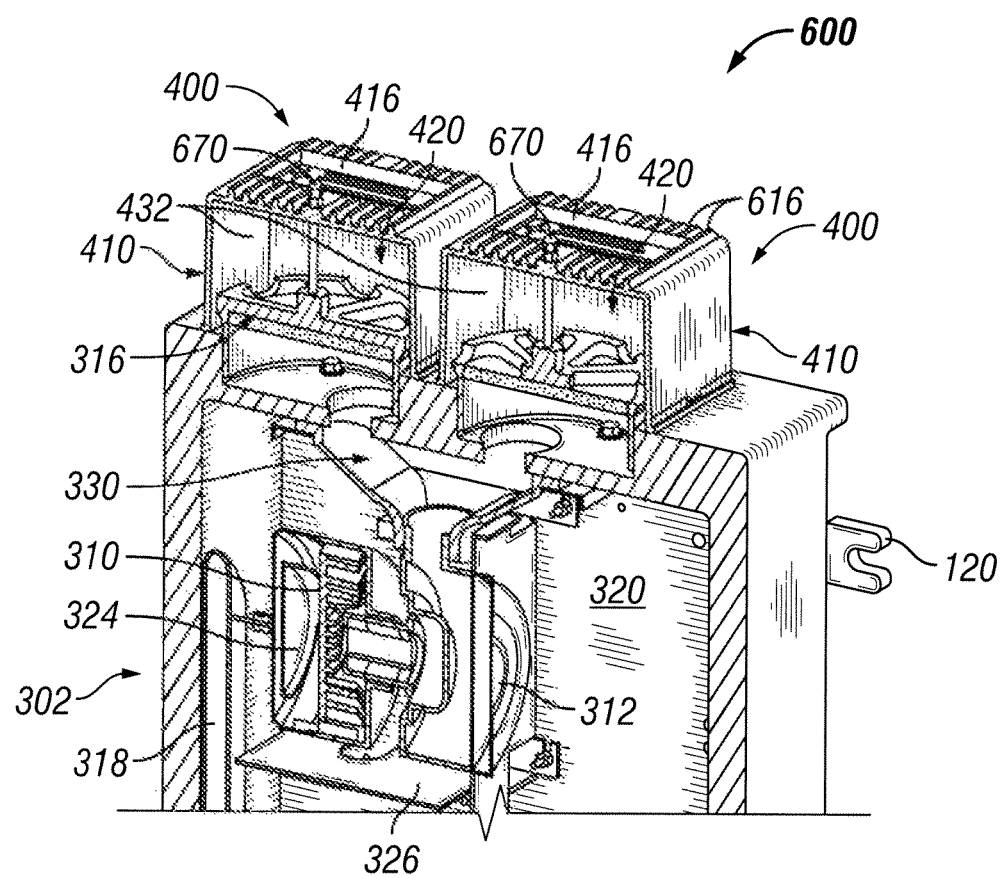

In one embodiment, the shroud 400 in FIG. 4 comprises a body 410 having a top end 416, a bottom surface 417 located opposite the top end 416, a first end at the bottom of FIG. 4, and a second end located at the top of the body opposite the first end, where the bottom surface 417 is configured to abut against an outer surface of a wall of an enclosure 302, which appears as the top wall of the enclosure 302 in FIGS. 6A and 6B. Returning to FIG. 4, the first end and the second end are disposed between and adjacent to the top end 416 and the bottom surface 417, where the bottom surface 417 forms a first aperture adjacent to a cavity 420. The cavity 420 is under the top end 416 of the body 410 and disposed toward the first end at the bottom of FIG. 4, and is configured to receive air that flows in a first direction through the first aperture 450 toward the top end 416. The first direction is substantially perpendicular to the top wall of the enclosure 302, and would be vertically upward in FIGS. 6A and 6B. The first direction in FIG. 4 would be from a point off the page pointed downward toward the aperture 450. The shroud 400 further comprises at least one non-linear channel disposed at a side of the cavity 420 between the top end 416 and the outer surface of the wall of the enclosure, where each of the at least one non-linear channels comprises a bent passage that can comprise a third end 432, and a fourth end 434, wherein the third end 432 adjoins the cavity 420, where the air flows through the at least one non-linear channel 430 between the cavity 420 and the fourth end 434 in a plurality of second directions, where the plurality of second directions is substantially parallel to the upper wall of the enclosure 302 in FIGS. 6A and 6B, where each second direction of the plurality of second directions is parallel to the outer surface of the wall of the enclosure where the body 410 abuts against the outer surface of the wall of the enclosure, where each second direction of the plurality of second directions is substantially perpendicular to the first direction. The shroud 400 further comprises a curved outlet 440 disposed at the second end of the body 410 and comprises a banana-shaped vent 441 that traverses at least two sides of the body 410, where the at least two sides are disposed between the top end 416 and the bottom surface 417, and wherein the fourth end 434 of each of the at least one non-linear channels 430 adjoins a portion of the banana-shaped vent 441 of the curved outlet 440, where the air flows in at least one second direction of the plurality of second directions, where the curved outlet 440 and the at least one non-linear channel 430 prevent substantially all liquids and solids outside the body 410 from entering the cavity 420, and where the air, once inside the cavity 420, is redirected in at least one second direction of the plurality of second directions toward the side of the cavity 420 and the third end 432 of the at least one non-linear channel 430 of FIG. 4.

Figure 5A:
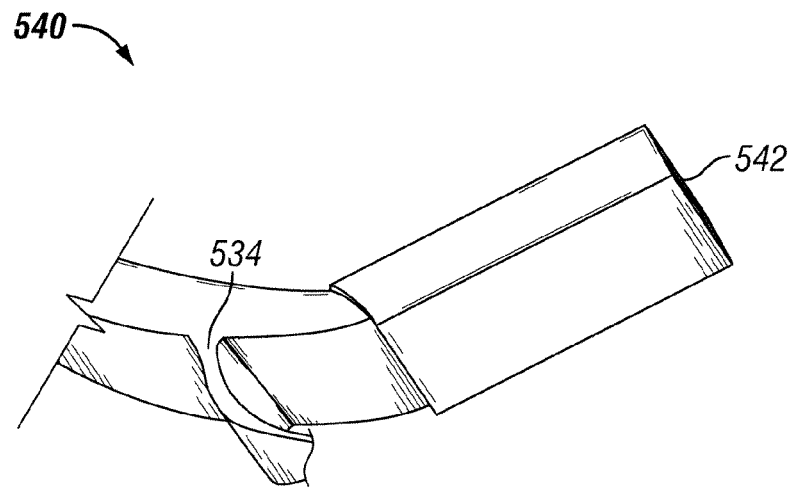
FIGS. 5A and 5B show various portions of an exemplary shroud in accordance with one or more exemplary embodiments.
Figure 5B:
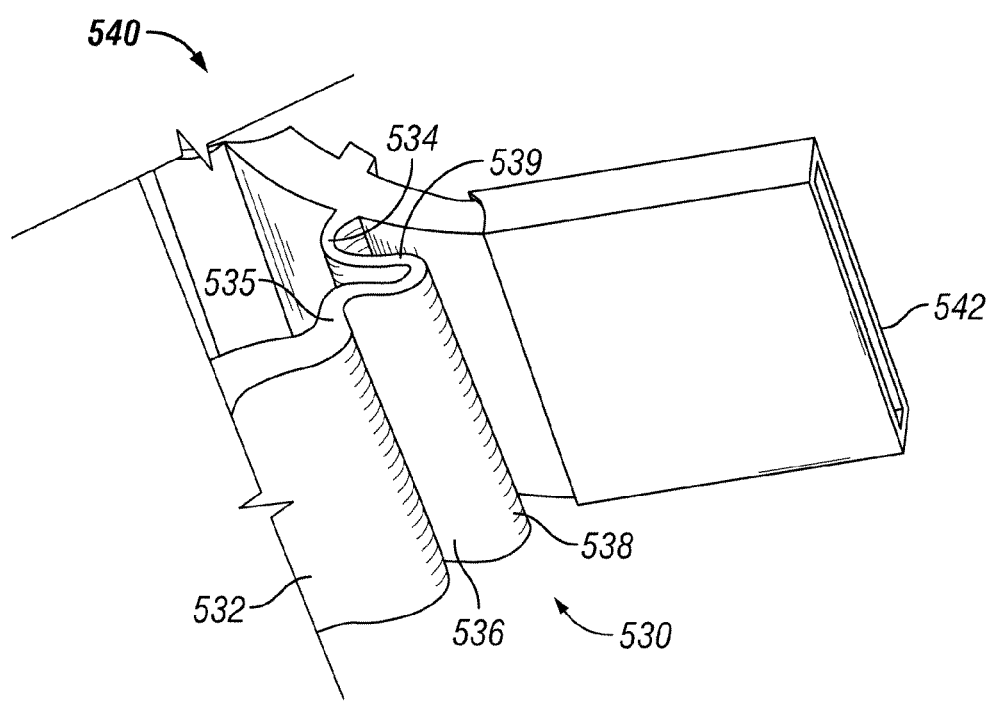

FIGS. 5A and 5B show various views of the channel 530 and outlet 540 in accordance with certain exemplary embodiments. The features of the channel 530 and the outlet 540 of FIGS. 5A and 5B are substantially similar to the features of the channel 430 and the outlet 440 described above with respect to FIG. 4. For example, the channel 530 has an open end 532 that adjoins the cavity (not shown in FIGS. 5A and 5B), followed by a bend 535 of over 90° (approximately 135°) that leads to a short, substantially straight segment 536, followed by another bend 538 of approximately 180°, followed by another substantially straight segment 539, followed by another bend 537 of approximately 90°, which forms the other end 534 of the channel 530 that adjoins the outlet 540. In FIGS. 5A and 5B, the outlet 540 is shown as being an elongated rectangle (in this case, having a width that is significantly larger than the height) that is curved along its length and terminates at the open end 542. The cross-sectional dimensions (length and/or width) of the outlet 540 can vary. Generally, as the cross-sectional area of the outlet 540 is increased, the velocity of the exhaust air passing from the channel 530 therethrough to outside the shroud is reduced. This, in turn, makes it easier for solids and/or liquids from outside the shroud to traverse the outlet 540 and the channel 530 to the cavity.

Similarly, with the channel 530 shown in FIG. 5B, as the cross-sectional area of the channel 530 is increased, the velocity of the exhaust air passing from the cavity therethrough to outside the outlet 540 is reduced. This, in turn, makes it easier for solids and/or liquids from outside the shroud to traverse the outlet 540 and the channel 530 to the cavity. Thus, the cross-sectional dimensions (length and/or width) of the channel 530 can vary. Further, the point along the outlet 540 at which the channel 530 adjoins the outlet 540 and/or the angle at which the channel 530 adjoins the outlet 540 (shown as being approximately 90° in FIGS. 4-5B) can vary. As these factors change, the back pressure (air flow) can be modified. In certain exemplary embodiments, the features and relative adjoinment of the channel 530 and the outlet 540 are optimized and/or adjusted to create a desired resistance (and thus a higher pressure) condition where the ends 534 of the non-linear channels 530 adjoin the vent. This, combined with the substantial back pressure created by the exhaust air filter assembly 316, can achieve a minimum back pressure (e.g., 1.13 pounds per square inch (psi)).

FIGS. 6A-C show various views of an enclosure system 600 that includes two exemplary shrouds 400 mechanically coupled to an enclosure 302 in accordance with one or more exemplary embodiments. Specifically, FIG. 6A shows a front perspective view of a portion of the enclosure system 600, while FIG. 6B shows a rear perspective view of the system 600. FIG. 6C shows the perspective view of FIG. 6A in cross section. The enclosure 302 of the enclosure system 600, as well as its components (e.g., the exhaust air filter assemblies 316, the air moving device 310, the exhaust air filter assembly 316), are substantially similar to the enclosure 302 and corresponding components described above with respect to FIG. 3. In addition, the shrouds 400 of FIGS. 6A-6C are substantially similar to the shroud 400 of FIG. 4.

In this case, as shown in FIGS. 6A-C, there are two shrouds 400, one covering and mechanically coupled to each of the two exhaust air filter assemblies 316. In certain exemplary embodiments, the body 410 of the shroud 400 creates a seal with the side (in this case, the top) of the explosion-proof enclosure 302 to help prevent liquids and/or solids from entering the cavity 420 by traversing between the side of the explosion-proof enclosure 302 and the bottom surface 417 of the body 410 of the shroud 400. In addition, or in the alternative, each channel (the open end 432 of which can be seen in FIG. 6C) of the shroud 400 can receive exhaust air flowing at a rate of at least 50 cubic feet per minute therethrough.

In this example, each shroud 400 is mechanically coupled to the enclosure 302 using a fastening device 670 in the form of an elongated bolt. Here, the fastening device 670 traverses an aperture (hidden from view by the fastening device 670) in the top end 416 of the body 410 of the shroud 400. The fastening device 670 also traverses at least part of an aperture in the exhaust air filter assembly 316. The top end 416 of the body 410 of the shroud 400 has a number of protrusions 616 that extend upward away from the body 410. Such protrusions 616 can be used to add structural integrity to the body 410 and/or to dissipate heat absorbed by the body 410. The same and/or different features can be disposed on the top end 416 and/or any other surface of the body 410 of a shroud 400.

Figure 7:
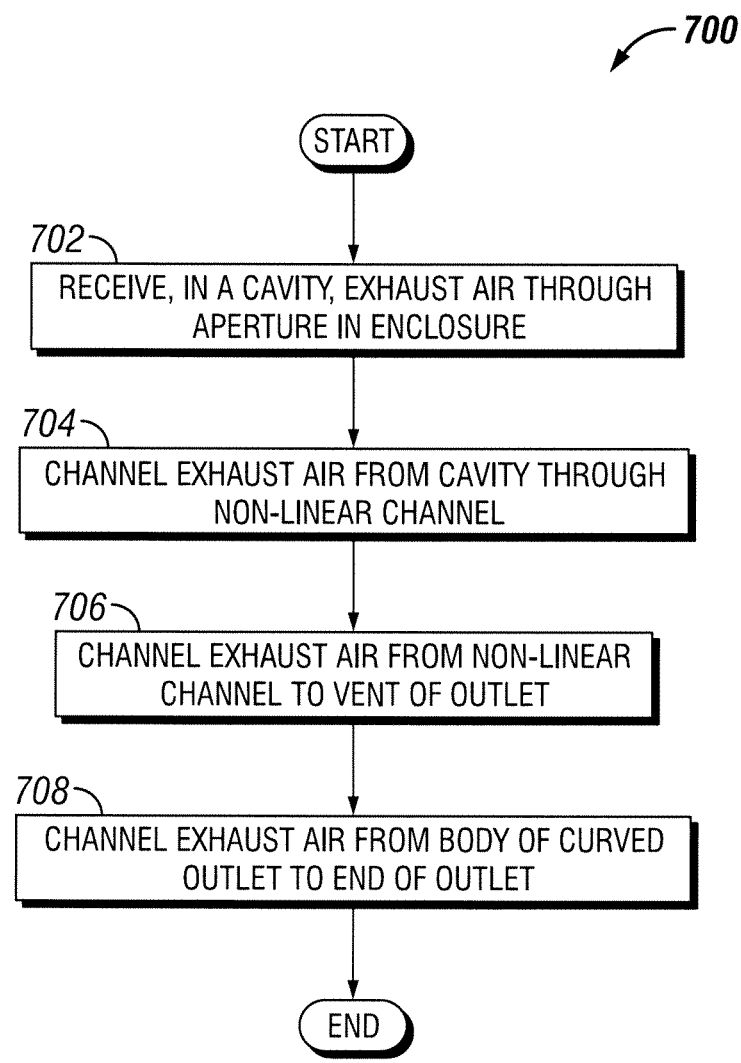
FIG. 7 shows a flowchart presenting a method for passing exhaust air out of an explosion-proof enclosure in accordance with one or more exemplary embodiments.

FIG. 7 shows a flowchart of a method 700 for passing exhaust air out of an explosion-proof enclosure in accordance with one or more exemplary embodiments. While the various steps in the flowchart presented herein are described sequentially, one of ordinary skill will appreciate that some or all of the steps may be executed in different orders, may be combined or omitted, and some or all of the steps may be executed in parallel. Further, in one or more of the exemplary embodiments, one or more of the steps described below may be omitted, repeated, and/or performed in a different order. In addition, a person of ordinary skill in the art will appreciate that additional steps may be included in performing the methods described herein. Accordingly, the specific arrangement of steps shown should not be construed as limiting the scope.

Referring now to FIGS. 1-7, the exemplary method 700 begins at the START step and continues to step 702, where exhaust air is received through an aperture in the enclosure 302. In certain exemplary embodiments, the exhaust air is received in the cavity 420 of a shroud 400. The aperture in the enclosure 302 through which the exhaust air is received can be, or be mechanically coupled to, an exhaust air filter assembly 316. The exhaust air can be received using an air moving device 310 and/or a pressure differential within the enclosure 302. In certain exemplary embodiments, the enclosure 302 is explosion-proof.

In step 704, the exhaust air is channeled from the cavity 420 through a non-linear channel 430. In certain exemplary embodiments, the channel 430 is also part of the shroud 400. The channel 430 can have at least one bend of at least 90° through which the exhaust air is channeled. The exhaust air is channeled using the force created by the air moving device 310 and/or a pressure differential within the enclosure 302.

In step 706, the exhaust air is channeled from the non-linear channel 430 to a vent 441 of an outlet 440. The outlet 440 can be straight, curved (e.g., banana-shaped), or otherwise non-linear. In certain exemplary embodiments, the outlet 440 is also part of the shroud 400. Again, exhaust air is channeled using the force created by the air moving device 310 and/or a pressure differential within the enclosure 302. In step 708, the exhaust air is channeled from the vent 441 of the outlet 440 to an outlet point 442 of the outlet 440. When the exhaust air reaches the outlet point 442 of the outlet 440, the exhaust air mixes with the ambient air in the atmosphere outside the shroud 400 and the enclosure 302. This method 700 not only allows air from inside the enclosure 302 to be expelled through the shroud 400, but the shroud 400 also prevents substantially all liquids and solids from entering the enclosure 302 through the shroud 400. The exemplary process then proceeds to the END step.

Using exemplary embodiments described herein, the shroud can be coupled to an enclosure, such as an explosion-proof enclosure, to prevent substantially all solids and liquids from entering the interior of the enclosure. The exemplary shroud can even prevent liquids from entering under extreme conditions. For example, if the enclosure is located outside, the exemplary shroud can prevent substantially all rain and snow from entering the interior of the enclosure. As another example, if the enclosure is subject to being washed down by a water hose or some other type of spray, the exemplary shroud can prevent substantially all of the water or other liquid being sprayed at the enclosure and/or the shroud from entering the interior of the enclosure.

Consequently, exemplary shrouds described herein can help the environment inside an enclosure to be maintained. As such, an enclosure that is required to maintain a type of rating (e.g., NEMA 4X, NEMA 7) can use the exemplary shroud to meet the requirements for such a rating. As an example, when a hose spraying pressurized water is directed at the shroud for over five seconds, more than 99% of the water passes through the vent without trickling through the channel and into the cavity. However, any solids and/or liquids that enter the cavity of the shroud do not enter the interior of the enclosure because the exhaust air filter assembly is raised above the surface of the enclosure and does not directly contact, but instead is positioned within the cavity of, the shroud. Further, because of the inherent resistance of the filter material of the exhaust air filter assembly, any liquid that enters the cavity of the shroud must establish sufficient head pressure (e.g., approximately 1 inch in depth above the top of the filter) before it can penetrate the filter. In addition, if there is air moving through the filter and subsequently the shroud, the liquid must also overcome that pressure (e.g., a total of approximately 1.13 psi) to enter the enclosure.

Although embodiments described herein are made with reference to exemplary embodiments, it should be appreciated by those skilled in the art that various modifications are well within the scope and spirit of this disclosure. Those skilled in the art will appreciate that the exemplary embodiments described herein are not limited to any specifically discussed application and that the embodiments described herein are illustrative and not restrictive. From the description of the exemplary embodiments, equivalents of the elements shown therein will suggest themselves to those skilled in the art, and ways of constructing other embodiments using the present disclosure will suggest themselves to practitioners of the art. Therefore, the scope of the exemplary embodiments is not limited herein.

We claim:

1. A shroud for an electrical enclosure comprising:
    a body having a top end, a bottom surface located opposite the top end, a first end, and a second end located opposite the first end, wherein the bottom surface is configured to abut against an outer surface of a wall of an enclosure, and wherein the first end and the second end are disposed between and adjacent to the top end and the bottom surface, wherein the bottom surface forms a first aperture adjacent to the cavity;
    a cavity under the top end of the body and disposed toward the first end, wherein the cavity is configured to receive air that flows in a first direction through the first aperture toward the top end, wherein the first direction is substantially perpendicular to the wall of the enclosure;
    at least one non-linear channel disposed at a side of the cavity between the top end and the outer surface of the wall of the enclosure, wherein each of the at least one non-linear channels comprises a bent passage, a third end, and a fourth end, wherein the third end adjoins the cavity, wherein the air flows through the at least one non-linear channel between the cavity and the fourth end in a plurality of second directions, wherein the plurality of second directions is substantially parallel to the wall of the enclosure, wherein each second direction of the plurality of second directions is parallel to the outer surface of the wall of the enclosure where the body abuts against the outer surface of the wall, wherein each second direction of the plurality of second directions is substantially perpendicular to the first direction; and
    a curved outlet disposed at the second end of the body and comprising a banana-shaped vent that traverses at least two sides of the body, wherein the at least two sides are disposed between the top end and the bottom surface, and wherein the fourth end of each of the at least one non-linear channels adjoins a portion of the banana-shaped vent of the curved outlet, wherein the air flows in at least one second direction of the plurality of second directions,
    wherein the curved outlet and the at least one non-linear channel prevent substantially all liquids and solids outside the body from entering the cavity, and
    wherein the air, once inside the cavity, is redirected in at least one second direction of the plurality of second directions toward the side of the cavity and the third end of the at least one non-linear channel.

2. The shroud of claim 1, wherein the enclosure is an explosion-proof enclosure.

3. The shroud of claim 1, wherein the body further comprises a second aperture in the top end, wherein the second aperture is configured to receive a fastening device to couple the shroud to the enclosure.

4. The shroud of claim 1, wherein the at least one non-linear channel is a pair of non-linear channels that are disposed symmetrically to each other with respect to a longitudinal axis along the body.

5. The shroud of claim 4, wherein each non-linear channel comprises at least one bend of at least 90 degrees.

6. The shroud of claim 4, wherein the pair of non-linear channels has a substantially similar shape to each other.

7. The shroud of claim 1, wherein the curved outlet has a first height that is less than a second height of the body.

8. The shroud of claim 1, further comprising at least one standoff disposed within the banana-shaped vent to support at least one wall of the curved outlet.

9. A system, comprising:
    an enclosure comprising a back wall and at least one side wall surrounding an interior;
    an air moving device disposed within the interior of the enclosure and having an inlet end and an exhaust end;
    a manifold disposed within the interior and comprising an inlet and an outlet, wherein the inlet is mechanically coupled to the exhaust end of the air moving device, and wherein the outlet is mechanically coupled to the at least one side wall of the enclosure, wherein the air moving device directs exhaust air through the exhaust end to the inlet of the manifold;
    an exhaust air filter assembly coupled to a first aperture in the at least one side wall of the enclosure and disposed within the outlet of the manifold, wherein the exhaust air filter assembly receives the exhaust air from the manifold; and
    a shroud mechanically coupled to an outer surface of the at least one side wall of the enclosure, wherein the shroud comprises:
        a body having a top end, a bottom surface opposite the top end, a first end and a second end located opposite the first end, wherein the bottom surface abuts against the outer surface of the at least one side wall of the enclosure, and wherein the first end and the second end are disposed between and adjacent to the top end and the bottom surface, wherein the bottom surface forms a second aperture adjacent to the cavity, and wherein the second aperture overlaps the first aperture in the at least one side wall of the enclosure;

a cavity under the top end of the body disposed toward the first end, wherein the exhaust air that flows in a first direction from the exhaust air filter assembly, through the second aperture, and toward the top end of the body, wherein the first direction is substantially perpendicular to the at least one side wall of the enclosure;

at least one non-linear channel disposed at a side of the cavity between the top end and the outer surface of the at least one side wall of the enclosure, wherein each of the at least one non-linear channels comprises a bent passage, a third end, and a fourth end, wherein the third end adjoins the cavity, wherein the exhaust air flows through the at least one non-linear channel between the cavity and the fourth end in a plurality of second directions, wherein the plurality of second directions is substantially parallel to the at least one side wall of the enclosure, wherein each second direction of the plurality of second directions is parallel to the outer surface of the at least one side wall of the enclosure where the body abuts against the outer surface of the at least one side wall, wherein each second direction of the plurality of second directions is substantially perpendicular to the first direction; and a curved outlet disposed at the second end of the body and comprising a banana-shaped vent that traverses at least two sides of the body, wherein the at least two sides are disposed between the top end and the bottom surface, and wherein the fourth end of each of the at least one non-linear channels adjoins a portion of the banana-shaped vent of the curved outlet, wherein the air flows in at least one second direction of the plurality of second directions, wherein the curved outlet and the at least one non-linear channel prevent substantially all liquids and solids outside the body from entering the cavity while allowing the exhaust air from inside the enclosure to vent outside the body of the shroud.

10. The system of claim 9, further comprising:
an additional exhaust air filter assembly coupled to an additional first aperture in the at least one wall of the enclosure and disposed within the outlet of the manifold; and
an additional shroud mechanically coupled to the outer surface of the enclosure.

11. The system of claim 9, wherein the exhaust air filter assembly comprises a sintered filter.

12. The system of claim 9, wherein the outer surface of the at least one side wall forms an angle with the back wall that is substantially perpendicular.

13. The system of claim 9, further comprising:
an additional exhaust air filter assembly coupled to an additional first aperture in the at least one wall of the enclosure and disposed within the outlet of the manifold,
wherein the cavity of the shroud receives exhaust air from inside the enclosure through the exhaust air filter assembly and the additional exhaust air filter assembly.

14. The system of claim 9, further comprising:
a sealing member disposed between the outer surface of the enclosure and a bottom portion of the shroud.

15. The system of claim 9, wherein the enclosure is an explosion-proof enclosure.

16. The system of claim 15, wherein the body creates a seal with the side of the explosion-proof enclosure to maintain a back pressure of at least 1.13 pounds per square inch.

17. The system of claim 15, wherein the at least one non-linear channel has a size and shape relative to the curved outlet to create a resistance condition that prevents substantially all liquids and solids outside the body from entering the cavity.

18. The system of claim 9, wherein the exhaust air filter assembly comprises a third aperture, wherein the top side of the body of the shroud comprises a fourth aperture, and wherein the shroud is mechanically coupled to the exhaust air filter assembly by a fastening device that traverses the third aperture and the fourth aperture.

19. The system of claim 9, wherein the at least one side wall is disposed on a top end of the enclosure.

20. A method for passing exhaust air out of an explosion-proof enclosure, the method comprising:
receiving, in a cavity of a shroud that abuts against an outer surface of a wall of the explosion-proof enclosure, the exhaust air through an aperture in the wall of the explosion-proof enclosure, wherein the exhaust air flows in a first direction toward a top end of the shroud that defines the cavity, wherein the first direction is substantially perpendicular to the at least one side wall of the explosion-proof enclosure;
directing the exhaust air away from the top end of the shroud, toward a side of the cavity of the shroud;
directing the exhaust air through a non-linear channel that adjoins the side of the cavity of the shroud, wherein the exhaust air flows through the at least one non-linear channel in a plurality of second directions, wherein each second direction of the plurality of second directions is parallel to the outer surface of the wall of the enclosure where the shroud abuts against the outer surface of the wall, and wherein each second direction of the plurality of second directions is substantially perpendicular to the first direction;
channeling the exhaust air from the non-linear channel of the shroud to a banana-shaped vent of a curved outlet of the shroud; and
channeling the exhaust air from the banana-shaped vent of the curved outlet of the shroud to an end of the curved outlet of the shroud in a plurality of third directions, wherein the end of the curved outlet is disposed on a side of the shroud between the top end and a bottom surface of the shroud, wherein the bottom surface is opposite the top end, wherein the side of the cavity is disposed between and adjacent to the bottom surface and the top end of the shroud, wherein the plurality of third directions is substantially perpendicular to the first direction, and
wherein the exhaust air exits the end of the curved outlet to the atmosphere, and wherein the curved outlet and the non-linear channel are configured to prevent substantially all liquids and solids outside the explosion-proof enclosure from entering the cavity of the shroud.

* * * * *